(12) United States Patent
Ashitaka et al.

(10) Patent No.: US 9,028,574 B2
(45) Date of Patent: May 12, 2015

(54) POLISHING COMPOSITION

(75) Inventors: Keiji Ashitaka, Kiyosu (JP); Hitoshi Morinaga, Kiyosu (JP); Akihito Yasui, Kiyosu (JP)

(73) Assignee: Fujimi Incorporated, Kiyosu-Shi (JP)

( * ) Notice: Subject to any disclaimer, the term of this patent is extended or adjusted under 35 U.S.C. 154(b) by 57 days.

(21) Appl. No.: 13/878,362

(22) PCT Filed: Oct. 6, 2011

(86) PCT No.: PCT/JP2011/073100
§ 371 (c)(1),
(2), (4) Date: Apr. 8, 2013

(87) PCT Pub. No.: WO2012/050044
PCT Pub. Date: Apr. 19, 2012

(65) Prior Publication Data
US 2013/0199106 A1 Aug. 8, 2013

(30) Foreign Application Priority Data

Oct. 12, 2010 (JP) ................. 2010-229720
Mar. 31, 2011 (JP) ................. 2011-079850

(51) Int. Cl.
C09K 3/14 (2006.01)
C09G 1/02 (2006.01)
H01L 21/3105 (2006.01)

(52) U.S. Cl.
CPC ............ *C09K 3/1409* (2013.01); *C09K 3/1463* (2013.01); *H01L 21/31053* (2013.01); *C09G 1/02* (2013.01)

(58) Field of Classification Search
None
See application file for complete search history.

(56) References Cited

U.S. PATENT DOCUMENTS

| 6,334,880 | B1 | 1/2002 | Negrych et al. |
| 7,972,398 | B2 | 7/2011 | Nishimoto et al. |
| 2008/0006057 | A1 | 1/2008 | Nishimoto et al. |
| 2011/0209413 | A1* | 9/2011 | Nishida et al. ................. 51/308 |

FOREIGN PATENT DOCUMENTS

| JP | 2004-207417 | A | | 7/2004 |
| JP | 2004-253058 | A | | 9/2004 |
| JP | 2004253058 | A | * | 9/2004 |
| JP | 2007-153732 | A | | 6/2007 |
| JP | 2008-013655 | A | | 1/2008 |
| JP | 2009-149493 | A | | 7/2009 |
| JP | 2010-250915 | A | | 11/2010 |

* cited by examiner

*Primary Examiner* — Kaj K Olsen
*Assistant Examiner* — Alexandra Moore
(74) *Attorney, Agent, or Firm* — Foley & Lardner LLP

(57) ABSTRACT

A polishing composition contains colloidal silica particles having protrusions on the surfaces thereof. The average of values respectively obtained by dividing the height of a protrusion on the surface of each particle belonging to the part of the colloidal silica particles that has larger particle diameters than the volume average particle diameter of the colloidal silica particles by the width of a base portion of the same protrusion is no less than 0.245. Preferably, the part of the colloidal silica particles that has larger particle diameter than the volume average particle diameter of the colloidal silica particles has an average aspect ratio of no less than 1.15. Preferably, the protrusions on the surfaces of particles belonging to the part of the colloidal silica particles that has larger particle diameters than the volume average particle diameter of the colloidal silica particles have an average height of no less than 3.5 nm.

5 Claims, 1 Drawing Sheet

POLISHING COMPOSITION

TECHNICAL FIELD

The present invention relates to a polishing composition mainly used in applications of polishing an object that is made of a semiconductor device material, for example, a semiconductor wafer, such as a silicon wafer.

BACKGROUND ART

Use of aspherical colloidal silica particles as abrasive grains of a polishing composition mainly for a purpose of improving a polishing rate is conventionally known. For example, Japanese Laid-Open Patent Publication No. 2007-153732 (Patent Document 1) discloses use of colloidal silica particles having numerous small protrusions on the surfaces thereof for mirror polishing of a silicon wafer. Also, Japanese Laid-Open Patent Publication No. 2009-149493 (Patent Document 2) discloses a polishing composition using, as abrasive grains, silica sol in which silica particles having a minor diameter/major diameter ratio in a range of 0.01 to 0.8 and having a plurality of wart-like protrusions on the surfaces thereof are contained.

However, there is still present a demand for a polishing composition containing colloidal silica particles that enables the realization of a higher polishing rate.

PRIOR ART DOCUMENTS

Patent Document 1: Japanese Laid-Open Patent Publication No. 2007-153732
Patent Document 2: Japanese Laid-Open Patent Publication No. 2009-149493

SUMMARY OF THE INVENTION

Problems that the Invention is to Solve

Accordingly, an objective of the present invention is to provide a polishing composition containing colloidal silica particles that is capable of realizing a higher polishing rate.

Means for Solving the Problems

To achieve the above objective and in accordance with one aspect of the present invention, a polishing composition is provided containing colloidal silica particles each having a surface with a plurality of protrusions, wherein part of the colloidal silica particles has larger particle diameters than a volume average particle diameter of the colloidal silica particles, and wherein an average of values respectively obtained by dividing a height of a protrusion on a surface of each particle belonging to the part of the colloidal silica particles by a width of a base portion of the same protrusion is no less than 0.245.

Preferably in the above aspect, the part of the colloidal silica particles that has larger particle diameters than a volume average particle diameter of the colloidal silica particles has an average aspect ratio of no less than 1.15.

Preferably in the above aspect, the protrusions on surfaces of particles belonging to the part of the colloidal silica particles that has larger particle diameters than a volume average particle diameter of the colloidal silica particles have an average height of no less than 3.5 nm.

Preferably in the above aspect, the colloidal silica particles have an average particle diameter, as determined by a dynamic light scattering method, in a range of 10 to 300 nm.

Preferably in the above aspect, the colloidal silica particles have a standard deviation in particle diameter of no less than 10 nm.

In accordance with another aspect of the present invention, colloidal silica particles is provide each having a surface with a plurality of protrusions, wherein part of the colloidal silica particles has larger particle diameters than a volume average particle diameter of the colloidal silica particles, and wherein an average of values respectively obtained by dividing a height of a protrusion on a surface of each particle belonging to the part of the colloidal silica particles by a width of a base portion of the same protrusion is no less than 0.245.

Effects of the Invention

According to the present invention, a polishing composition containing colloidal silica particles that is capable of realizing a higher polishing rate can be provided.

MODES FOR CARRYING OUT THE INVENTION

An embodiment of the present invention will now be described.

A polishing composition according to the present embodiment contains at least colloidal silica particles each having a surface with a plurality of protrusions and is mainly used in applications of polishing an object that is made of a semiconductor device material, for example, a semiconductor wafer, such as a silicon wafer or a compound semiconductor wafer, or a film of dielectric substance or conductive substance formed on a wafer.

The average number of protrusions that each colloidal silica particle in the polishing composition has on the surface thereof is preferably no less than three and more preferably no less than five.

Figure 1:
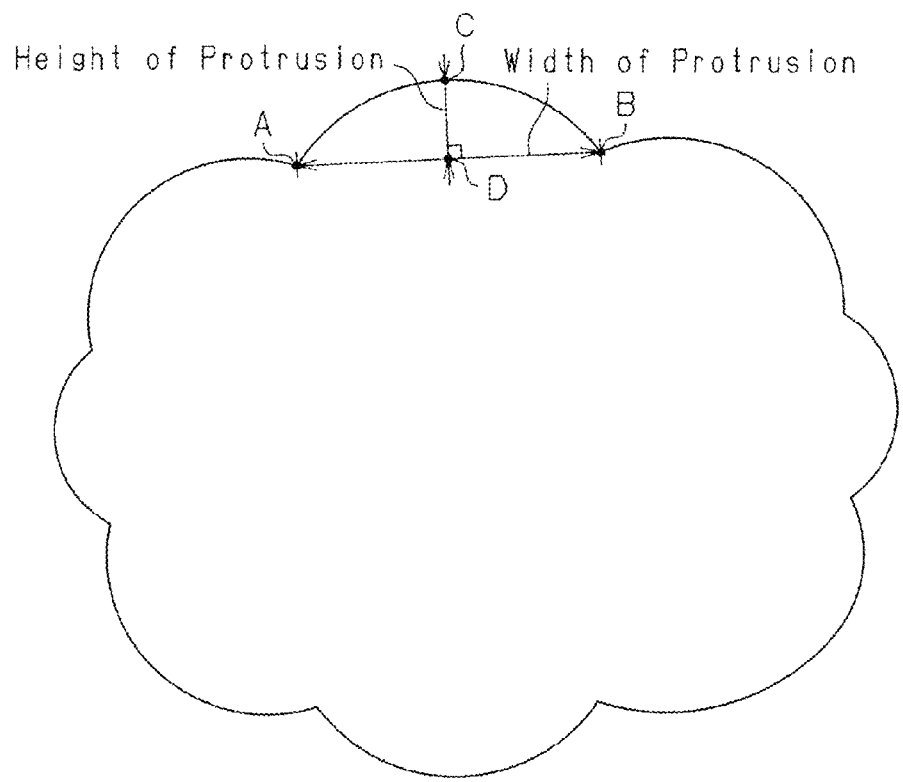
FIG. 1 is a diagram showing a projected contour of an outer shape of a colloidal silica particle contained in a polishing composition according to an embodiment of the present invention.

A protrusion as referred to here has a sufficiently small height and width in comparison to the particle diameter of a colloidal silica particle. Further, a protrusion is such that the length of a portion indicated in FIG. 1 as a curve AB that passes through a point A and a point B does not exceed one-fourth of the circumferential length of the maximum inscribed circle of a colloidal silica particle, or more accurately, the circumferential length of the maximum circle inscribed in a projected contour of the outer shape of the colloidal silica particle. The width of a protrusion refers to a width of a base portion of the protrusion and is expressed in FIG. 1 as a distance between the point A and the point B. The height of a protrusion refers to a distance between the base portion of the protrusion and a portion of the protrusion furthest from the base portion and is expressed in FIG. 1 as a length of a segment CD, which is orthogonal to a straight line AB.

The average of values respectively obtained by dividing the height of a protrusion on the surface of each particle belonging to the part of the colloidal silica particles that has larger particle diameters than the volume average particle diameter of the colloidal silica particles by the width of the same protrusion at the base portion must be no less than 0.245 and is preferably no less than 0.255. When the average of the above values is no less than 0.245, it is possible to achieve a high polishing rate because the shapes of the protrusions are comparatively sharp. When the average of the values is no less than 0.255, the polishing rate with the polishing composition is improved further. The height of each protrusion of a colloidal silica particle and the width of the protrusion at the base portion can be determined by using general image analysis software to analyze an image of the colloidal silica particle taken by a scanning electron microscope.

The part of the colloidal silica particles that has larger particle diameters than the volume average particle diameters of the colloidal silica particles has an average aspect ratio of preferably no less than 1.15 and more preferably no less than 1.20. In this case, it is advantageous to improve the polishing rate with the polishing composition. The average aspect ratio of colloidal silica particles is an average of values respectively obtained by dividing the length of the long side of a minimum rectangle that circumscribes a colloidal silica particle in an image taken by a scanning electron microscope, by the length of the short side of the same rectangle, and can be determined by using general image analysis software.

The protrusions on the surfaces of particles belonging to the part of the colloidal silica particles that has larger particle diameters than the volume average particle diameter of the colloidal silica particles have an average height of no less than 3.5 nm and more preferably no less than 4.0 nm. In this case, it is advantageous to improve the polishing rate with the polishing composition. As with the average aspect ratio, the average height of protrusions of colloidal silica particles can be determined by using general image analysis software.

Preferably, the colloidal silica particles in the polishing composition have an average particle diameter, as determined by a dynamic light scattering method, in a range of 10 to 300 nm. In this case, in addition to the polishing composition being improved in sedimentation stability, it is advantageous to obtain a satisfactory surface roughness on an object to be polished after being polished with the polishing composition.

The colloidal silica particles in the polishing composition preferably have a broad particle size distribution rather than a narrow one. In other words, the colloidal silica particles in the polishing composition preferably have a large standard deviation in particle diameters, and specifically have a standard deviation of no less than 10 nm and more preferably no less than 14 nm. In this case, it is advantageous to improve the polishing rate with the polishing composition. The standard deviation in particle diameter of colloidal silica particles is determined as a standard deviation of diameters of circles having the same areas as those measured from the colloidal silica particles in an image taken by a scanning electron microscope, and this can also be determined by using general image analysis software.

A preferable purity of the colloidal silica in the polishing composition differs according to the applications of the polishing composition. In a case of a polishing composition used in an application of polishing a wafer, made of a semiconductor, such as silicon, germanium, gallium arsenide, indium arsenide, indium phosphide, or gallium nitride, or a semiconductor device that uses the wafer, it is required that the colloidal silica used be of high purity. Specifically, it is preferable for a total amount of metal impurities contained in the colloidal silica, such as sodium, potassium, calcium, boron, aluminum, titanium, zirconium, manganese, iron, cobalt, copper, zinc, silver, and lead, to be no more than 1 ppm. Colloidal silica of such high purity can be manufactured by using an alkoxysilane as a raw material. The amount of metal impurities in the colloidal silica can be measured, for example, by an ICP mass spectrometry apparatus. In a case of a polishing composition used in an application of polishing a hard disk substrate, the colloidal silica used does not have to be of very high purity and it is advantageous in terms of cost to use colloidal silica that can be manufactured at low cost by using, for example, sodium silicate as a raw material. In a case where the polishing composition is to be used in an application where sodium contamination is undesirable, colloidal silica manufactured using active silica or potassium silicate of low sodium content in place of sodium silicate may be used.

A general method for manufacturing colloidal silica by hydrolysis of an alkoxysilane is described, for example, in pp. 154 to 156 of "Science of the Sol-Gel Method (in Japanese)", written by Sumio Sakka. Also, Japanese Laid-Open Patent Publication No. 11-60232 discloses a cocoon-shaped colloidal silica manufactured by dripping methyl silicate or a mixture of methyl silicate and methanol into a mixed solvent made up of water, methanol, and ammonia or ammonia and an ammonium salt and making methyl silicate and water react. Japanese Laid-Open Patent Publication No. 2001-48520 discloses elongated colloidal silica manufactured by hydrolyzing an alkyl silicate by using an acid catalyst and thereafter adding an alkali catalyst and heating to make polymerization of silicic acid proceed and make particles grow. Japanese Laid-Open Patent Publication No. 2007-153732 discloses that colloidal silica having numerous small protrusions can be manufactured by using a specific amount of a specific type of hydrolysis catalyst.

Manufacture of colloidal silica using sodium silicate as a raw material is generally performed by ion exchange of sodium silicate. Japanese Laid-Open Patent Publication No. 2002-338232 describes secondary aggregation of monodisperse colloidal silica into spherical forms by addition of an aggregating agent. Japanese Laid-Open Patent Publication No. 07-118008 and International Publication No. WO 2007/018069 disclose the addition of a calcium salt or a magnesium salt to active silica obtained from sodium silicate to obtain odd-shaped colloidal silica, such as elongated colloidal silica. Japanese Laid-Open Patent Publication No. 2001-11433 discloses that beaded colloidal silica is obtained by addition of a calcium salt to active silica obtained from sodium silicate. Japanese Laid-Open Patent Publication No. 2008-169102 discloses that colloidal silica having numerous small protrusions like Japanese Confetti can be manufactured by forming and growing microparticles on the surfaces of seed particles.

The colloidal silica particles contained in the polishing composition according to the present embodiment may be manufactured by making a plurality of protrusions form on the surfaces of odd-shaped or aspherical colloidal silica particles or on the surfaces of odd-shaped aggregates each made up of spherical colloidal silica particles. Alternatively, they may be manufactured by making colloidal silica particles that have protrusions aggregate together. Obtaining of spherical or odd-shaped colloidal silica particles, aggregation of colloidal silica particles, or forming of a plurality of protrusions on the surfaces of colloidal silica particles or on the surfaces of aggregates of colloidal silica particles can be performed in accordance with the disclosure in the documents cited in the two immediately preceding paragraphs. For example, colloidal silica particles having protrusions on the surfaces can be manufactured by the following method. First, an alkoxysilane is hydrolyzed by being added continuously to a mixed solution of methanol and water in which ammonia water is added as a catalyst, so as to obtain slurry containing odd-shaped colloidal silica particles. The slurry obtained is heated to distill off the methanol and ammonia. Thereafter, an organic amine is added as a catalyst to the slurry and then the alkoxysilane is added continuously and hydrolyzed again at a temperature of no less than 70° C. Protrusions are thereby formed on the surfaces of the odd-shaped colloidal silica particles.

According to the present embodiment, the following advantages are obtained.

The average of values respectively obtained by dividing the height of a protrusion on the surface of each particle belonging to the part of the colloidal silica particles that has larger particle diameters than the volume average particle diameter of the colloidal silica particles by the width of the same protrusion at the base portion is no less than 0.245. The polishing composition according to the present embodiment can thereby polish an object to be polished at a high polishing rate and can be used favorably in an application of polishing an object that is made, for example, of a semiconductor device material.

The embodiment may be modified as follows.

The polishing composition according to the embodiment may further contain a known additive. For example, any of (a) an alkali, such as a hydroxide of an alkali metal, an alkali metal salt, ammonia, an ammonium salt, an amine, an amine compound, a quaternary ammonium hydroxide, or a quaternary ammonium salt, (b) an inorganic acid, such as hydrochloric acid, phosphoric acid, sulfuric acid, phosphonic acid, nitric acid, phosphinic acid, or boric acid, or an organic acid, such as acetic acid, itaconic acid, succinic acid, tartaric acid, citric acid, maleic acid, glycolic acid, malonic acid, methanesulfonic acid, formic acid, malic acid, gluconic acid, alanine, glycine, lactic acid, hydroxyethylidene diphosphonic acid (HEDP), nitrilotris[methylene phosphonic acid] (NTMP), or phosphonobutane tricarboxylic acid (PBTC), (c) a nonionic, anionic, cationic, or amphoteric surfactant, (d) a water-soluble polymer, such as a water-soluble cellulose, a vinyl-based polymer, or a polyalkylene oxide, (e) a chelating agent, such as a polyamine, a polyphosphonic acid, a polyaminocarboxylic acid, or a polyaminophosphonic acid, (f) an oxidizing agent, such as hydrogen peroxide, a peroxide, an oxoacid, or an acidic metal chloride compound, and (g) a fungicide, a disinfectant, a biocide, or other additive may be contained.

The polishing composition according to the embodiment may be prepared by diluting a stock solution of the polishing composition with water.

The polishing composition according to the embodiment may be used in an application other than polishing an object that is made of a semiconductor device material.

Next, Examples and Comparative Examples of the present invention will be described.

Figure 2A:
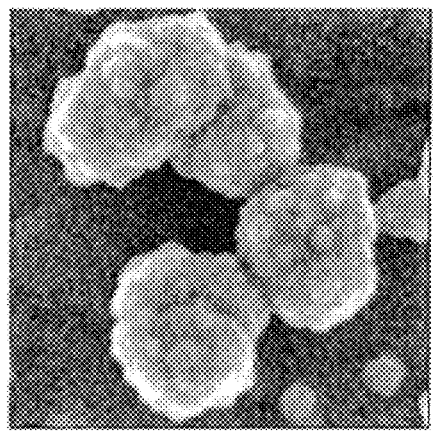
FIG. 2(a) is a scanning electron micrograph of colloidal silica particles in a polishing composition of Example 1.
Figure 2B:
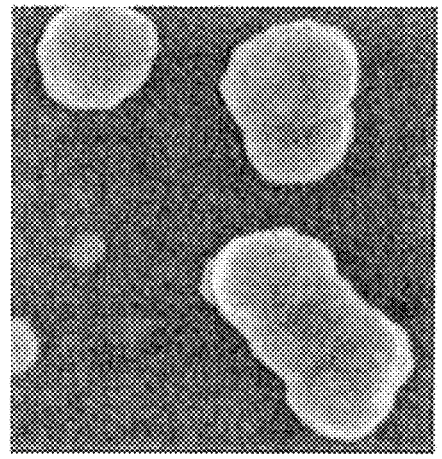
FIG. 2(b) is a scanning electron micrograph of colloidal silica particles in a polishing composition of Comparative Example 3.

With each of Examples 1 and 2 and Comparative Examples 1 to 6, a polishing composition was prepared by diluting colloidal silica slurry with pure water and thereafter adjusting to pH 11.0 using a 48% by mass potassium hydroxide aqueous solution. The content of colloidal silica particles in each of the polishing compositions was 5.0% by mass. Details of the colloidal silica particles contained in each polishing composition and results of measuring values of polishing rates using each polishing composition are shown in Table 1. For reference, scanning electron micrographs of the colloidal silica particles in the polishing compositions of Example 1 and Comparative Example 3 are shown in FIG. 2(a) and FIG. 2(b), respectively.

TABLE 1

|  | Average width of protrusions [nm] | Average height of protrusions [nm] | Average of protrusion height/ protrusion width | Average aspect ratio | Average particle diameter [nm] | Standard deviation in particle diameter [nm] | Polishing rate [Å/min] |
| --- | --- | --- | --- | --- | --- | --- | --- |
| Example 1 | 16.1 | 4.89 | 0.304 | 1.22 | 85 | 19.8 | 1481 |
| Example 2 | 21.5 | 5.72 | 0.266 | 1.36 | 183 | 30.3 | 1784 |
| Comparative Example 1 | 0 | 0 | 0 | 1.35 | 69 | 11.5 | 560 |
| Comparative Example 2 | 0 | 0 | 0 | 1.07 | 111 | 10.5 | 639 |
| Comparative Example 3 | 19.9 | 3.38 | 0.170 | 1.22 | 85 | 26.6 | 1054 |
| Comparative Example 4 | 29.9 | 5.64 | 0.189 | 1.04 | 108 | 9.4 | 1032 |
| Comparative Example 5 | 14.4 | 3.48 | 0.242 | 1.12 | 45 | 13.6 | 583 |
| Comparative Example 6 | 27.8 | 4.67 | 0.168 | 1.36 | 211 | 67.1 | 1346 |

Results of measuring the average of the widths of the base portions of the protrusions on the surfaces of particles belonging to the part of the colloidal silica particles in each polishing composition that has larger particle diameters than the volume average particle diameter of the colloidal silica particles are indicated in the "Average width of protrusions" column of Table 1.

Results of measuring the average of the heights of the protrusions on the surfaces of particles belonging to the part of the colloidal silica particles in each polishing composition that has larger particle diameters than the volume average particle diameter of the colloidal silica particles are indicated in the "Average height of protrusions" column of Table 1.

Results of measuring the average of values respectively obtained by dividing the height of a protrusion on the surface of each particle belonging to the part of the colloidal silica particles in each polishing composition that has larger particle diameters than the volume average particle diameter of the colloidal silica particles by the width of the same protrusion at the base portion are indicated in the "Average of protrusion height/protrusion width" column of Table 1.

Results of measuring the average aspect ratio of particles belonging to the part of the colloidal silica particles in each polishing composition that has larger particle diameters than the volume average particle diameter of the colloidal silica particles are indicated in the "Average aspect ratio" column of Table 1.

Results of measuring the average particle diameter of the colloidal silica particles in each polishing composition by a dynamic light scattering particle size distribution measuring apparatus are shown in the "Average particle diameter" column of Table 1.

Results of measuring the standard deviation in particle diameter of the colloidal silica particles in each polishing composition are indicated in the "Standard deviation in particle diameter" column of Table 1.

Polishing rates when the surface of a PE-TEOS (plasma-enhanced tetraethyl orthosilicate) blanket wafer was polished under the polishing conditions shown in Table 2 using each polishing composition are indicated in the "Polishing rate" column of Table 1. Each polishing rate value was determined in accordance with the following calculation formula and based on the weights of the wafer before and after polishing that were measured using a precision electronic balance.

Polishing rate [Å/min]=Difference of the weights of the wafer before and after polishing [g]/Polishing time [min]/Area of the wafer surface [cm$^2$] (=20.26 cm$^2$)/True density of TEOS [g/cm$^3$] (=2.2 g/cm$^3$)×10$^8$

TABLE 2

Polishing machine: "CP-4" made by CETR Corp.
Polishing pad: "IC1000 A2 PAD DD1 (kgrv)" made by Nitta Haas Incorporated
Object to be polished: 50.8 mm diameter PE-TEOS blanket wafer
Rotation speed of head: 300 rpm
Rotation speed of platen: 300 rpm
Linear speed: 113 m/min
Feed rate of polishing composition: 20 mL/min
Polishing time: 1 min
Polishing pressure: 34.48 kPa As shown in Table 1, in each of the cases where the polishing compositions of Examples 1 and 2 were used, a high polishing rate exceeding 1400 Å/min was obtained. On the other hand, in each of the cases of using the polishing compositions of Comparative Examples 1 to 6, in each of which the average value of protrusion height/protrusion width of the colloidal silica particles is less than 0.245, the value of the polishing rate obtained was low. A trend was seen in which the polishing rate value obtained increases with increasing the average particle diameter of the colloidal silica particles. However, when the average value of protrusion height/protrusion width of the colloidal silica particles is less than 0.245 and further when the average aspect ratio of the colloidal particles is less than 1.15, it was difficult to obtain a polishing rate exceeding 1400 Å/min even when the average particle diameter of the colloidal silica particles was increased.

The invention claimed is:

1. A polishing composition comprising colloidal silica particles each having a surface with a plurality of protrusions, wherein
    each of the protrusions includes a base portion and a distal portion the distance between which is defined as a height of the protrusion, the base portion having a width, the colloidal silica particles have a volume average particle diameter and include large colloidal silica particles that each have a particle diameter larger than the volume average particle diameter,
    an average of values respectively obtained by dividing the height of a protrusion on the surface of each of the large colloidal silica particles by the width of the base portion of the same protrusion is no less than 0.245,
    the length of a curve along the surface of each protrusion of each colloidal silica particle does not exceed one-fourth of a circumferential length of a maximum circle inscribed in a projected contour of an outer shape of the colloidal silica particle, the curve extending from the base portion of a protrusion to the opposite base portion of the protrusion and passing through a point on the protrusion furthest from the base portion.

2. The polishing composition according to claim 1, wherein the large colloidal silica particles have an average aspect ratio of no less than 1.15.

3. The polishing composition according to claim 1, wherein the protrusions on surfaces of the large colloidal silica particles have an average height of no less than 3.5 nm.

4. The polishing composition according to claim 1, wherein the colloidal silica particles have an average particle diameter, as determined by a dynamic light scattering method, in a range of 10 to 300 nm.

5. The polishing composition according to claim 1, wherein the colloidal silica particles have a standard deviation in particle diameter of no less than 10 nm.

* * * * *